United States Patent
Hsieh (10) Patent No.: US 7,626,231 B1
(45) Date of Patent: Dec. 1, 2009

(54) INTEGRATED TRENCH MOSFET AND JUNCTION BARRIER SCHOTTKY RECTIFIER WITH TRENCH CONTACT STRUCTURES

(75) Inventor: Fu-Yuan Hsieh, Hsingchu (TW)

(73) Assignee: Force Mos Technology Co., Ltd., HsinChu (TW)

( * ) Notice: Subject to any disclaimer, the term of this patent is extended or adjusted under 35 U.S.C. 154(b) by 38 days.

(21) Appl. No.: 12/213,629

(22) Filed: Jun. 23, 2008

(51) Int. Cl.
*H01L 29/76* (2006.01)
(52) U.S. Cl. .................. 257/334; 257/330; 257/332
(58) Field of Classification Search .............. 257/334, 257/332, 330
See application file for complete search history.

(56) References Cited

U.S. PATENT DOCUMENTS

| | | | |
|---|---|---|---|
| 2008/0242029 A1* | 10/2008 | Wu et al. ............... | 438/270 |
| 2009/0008706 A1* | 1/2009 | Yedinak et al. .......... | 257/328 |
| 2009/0072301 A1* | 3/2009 | Bhalla et al. ............ | 257/328 |

* cited by examiner

*Primary Examiner*—Long Pham
(74) *Attorney, Agent, or Firm*—Bacon & Thomas, PLLC (57) ABSTRACT

A trench MOSFET in parallel with trench junction barrier Schottky rectifier with trench contact structures is formed in single chip. The present invention solves the drawback brought by some prior arts, for example, the large area occupied by planar contact structure and high gate-source capacitance. As the electronic devices become more miniaturized, the trench contact structures of this invention are able to be shrunk to achieve low specific on-resistance of Trench MOSFET, and low Vf and reverse leakage current of the Schottky Rectifier.

8 Claims, 7 Drawing Sheets

INTEGRATED TRENCH MOSFET AND JUNCTION BARRIER SCHOTTKY RECTIFIER WITH TRENCH CONTACT STRUCTURES

BACKGROUND OF THE INVENTION

1. Field of the Invention

This invention relates generally to the cell structure, device configuration and fabrication process of power semiconductor devices. More particularly, this invention relates to an improved cell configuration and processes to manufacture trench MOSFET device with junction barrier Schottky rectifier in the same cell so that integrated cells with spacing savings and lower capacitance and higher performance are achieved.

2. The Prior Arts

Figure 1:
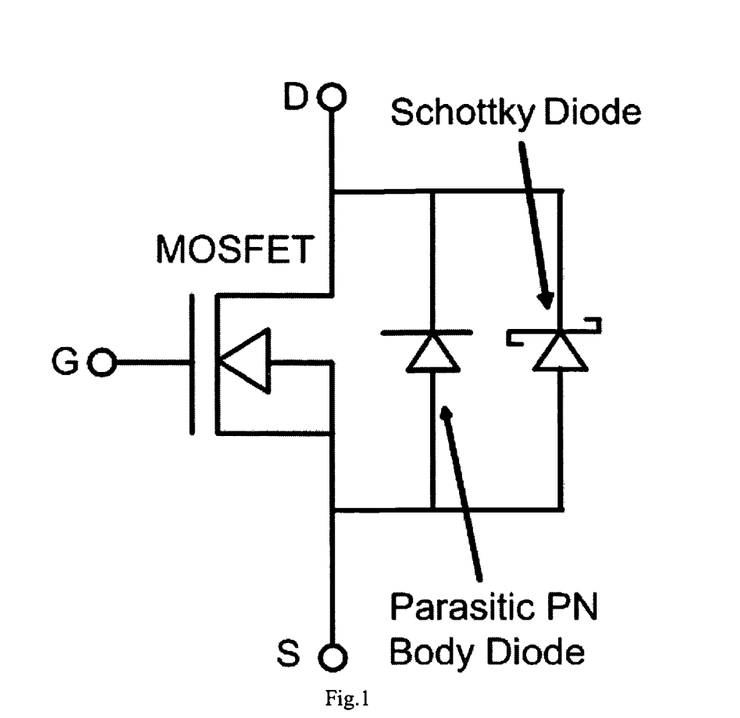
FIG. 1 is a conventional application circuit of diode in parallel with the MOSFET power device.

Normally for high efficiency DC/DC application, a Schottky rectifier is externally added in parallel with a MOSFET device. FIG. 1 is a circuit diagram that illustrates the implementation of a Schottky diode with a power MOSFET device. Once the parasitic P/N diode is turned on, both the electron and hole carriers are generated thus require longer time to eliminate the carriers by electron-hole combination. In order to achieve higher speed and efficiency, the Schottky diode (SKY) is connected in parallel to the MOSFET device with the parasitic PN body diode to function as a clamping diode to prevent the body diode from turning on. The Schottky Diode is single carrier, i.e., electron carrier only and that can be drawn simply by the drain Electrode. The requirement for the clamping effect is that the Forward Voltage of the Schottky diode Vf is less than the parasitic PN diode (~0.7V). As the electronic devices become more miniaturized, there is requirement to integrate the Schottky diode as part of the semiconductor power device as an IC chip to reduce the space occupied by the Schottky diode instead of connecting the Schottky diode as an external electronic component.

Figure 2:
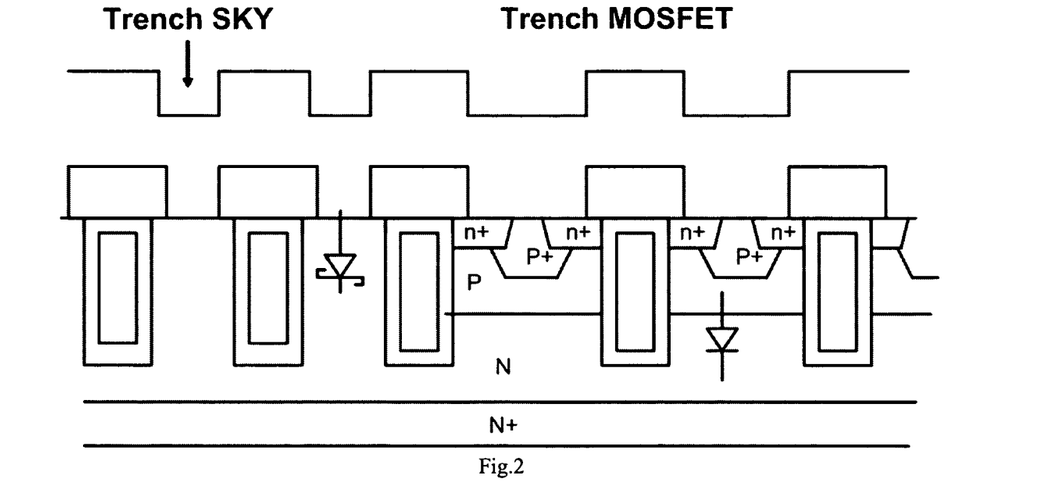
FIG. 2 is a side cross-sectional view of an integrating method of prior art.
Figure 3:
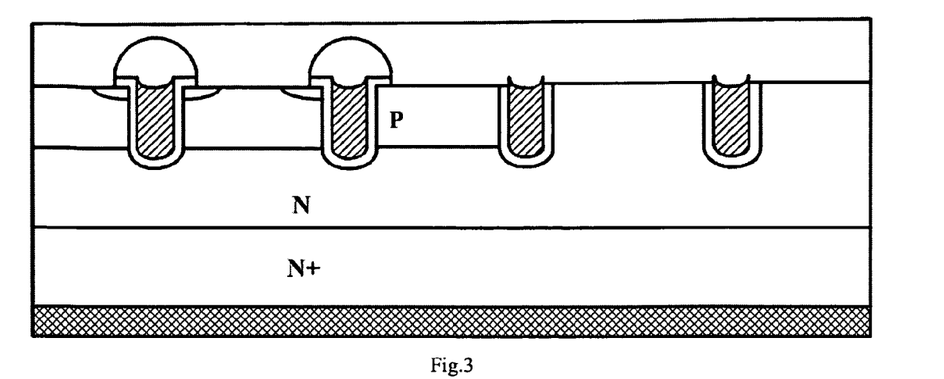
FIG. 3 is a side cross-sectional view of another integrating method of yet another prior art.

In U.S. Pat. No. 6,351,018, a trenched MOSFET device integrated with trench Schottky diodes with common trench gates is disclosed as that shown in FIG. 2. In U.S. Pat. No. 6,593,620 discloses another trench MOSFET device with a trench Schottky diode with separated trench gates as shown in FIG. 3. In U.S. Pat. No. 6,987,305 (not shown) discloses another trench MOSFET device which is similar to U.S. Pat. No. 6,593,620 except thick gate oxide on trench bottom. The configurations as disclosed in the patented invention have a disadvantage that the Schottky diodes occupy additional space for planar contact that is about the same space as the MOSFET. The Trench Schottky diodes further suffer from a high leakage between drain and source due to phosphorus increase at channel region during the sacrificial and gate oxidation processes. Furthermore, the device as shown has a higher capacitance due to the presence of the trench MOS-Schottky structure which has inherent parasitic capacitance from trench sidewall and bottom in trench MOS-Schottky.

Figure 4:
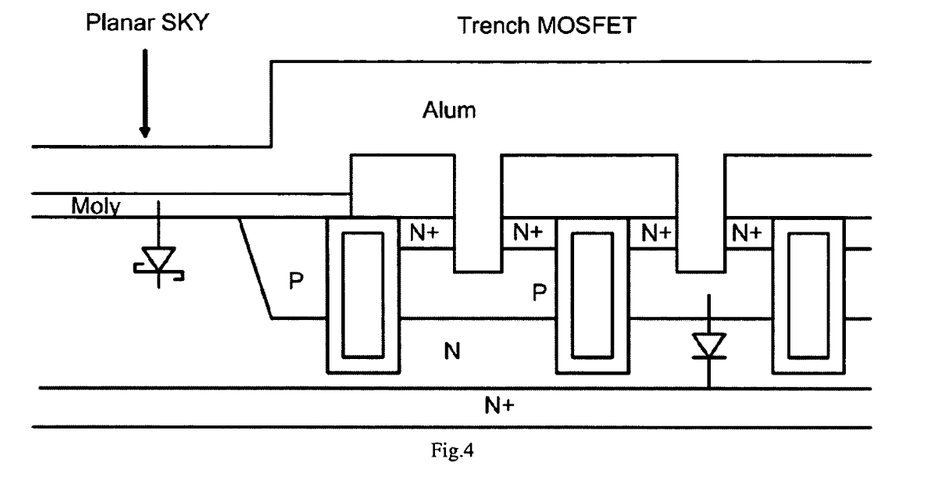
FIG. 4 is a side cross-sectional view of another integrating method of yet another prior art.

In U.S. Pat. No. 6,433,396, a trench MOSFET device with a planar Schottky diode is disclosed as that shown in FIG. 4. The configuration again has disadvantages that the Schottky diode occupies additional space for planar contact and reverse leakage current Ir between anode and cathode is high. Also, the formation process requires additional contact mask for the Schottky diode thus increases the cost and processes complications for producing the MOSFET power device with Schottky diode.

Figure 5:
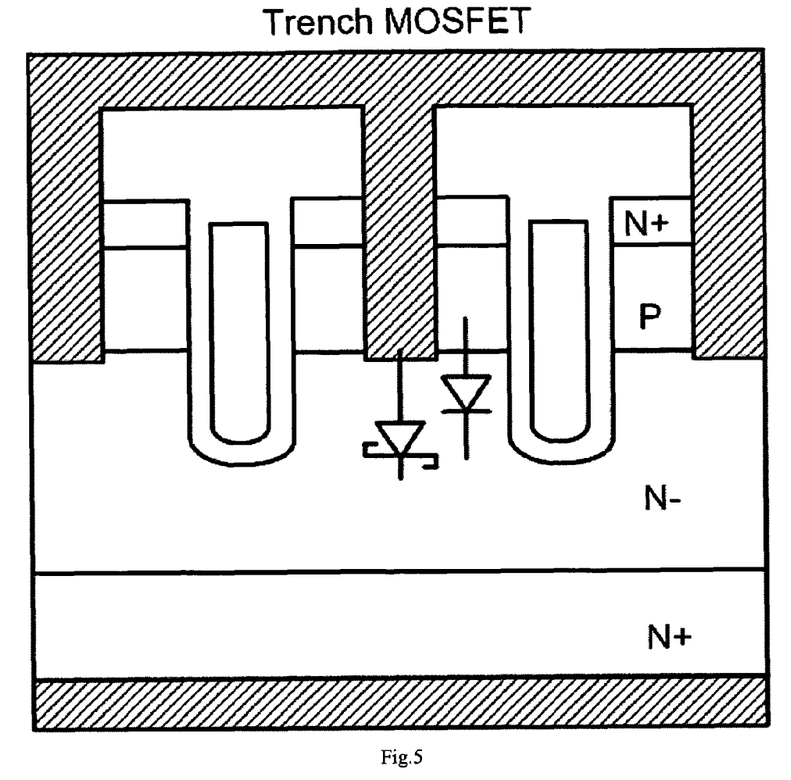
FIG. 5 is a side cross-sectional view of another integrating method of yet another prior art.

In U.S. Pat. No. 6,998,678 discloses another trench semiconductor arrangement as shown in FIG. 5 with a MOS transistor which has a gate electrode, arranged in a trench running in the vertical direction of a semiconductor body, and a Schottky diode which is connected in parallel with a drain-source path (D-S) and is formed by a Schottky contact between a source electrode and the semiconductor body The configuration has disadvantage that it is difficult to optimize both performance of the Schottky diode and the trench MOSFET when they share same mesa space between two adjacent trenches and same source trench contact. Furthermore, the manufacturing cost is increased due to the requirement that an additional P+ mask is required to form the trench Schottky diodes.

Therefore, there is still a need in the art of the semiconductor device fabrication, particularly for design and fabrication of the trenched power device, to provide a novel cell structure, device configuration and fabrication process that would resolve these difficulties and design limitations. Specifically, it is desirable to provide more integrated trench MOSFET with embedded Schottky diode that can accomplish space saving, process simplification and capacitance reduction such that the above discussed technical limitations can be resolved.

SUMMARY OF THE INVENTION

It is therefore an aspect of the present invention to provide improved semiconductor power device configuration and manufacture processes for providing semiconductor power devices with trench junction barrier Schottky rectifier in single chip with trench Schottky contact instead of planar contact as shown in above prior arts so that space occupied which is one of the major technical limitations discussed above can be reduced.

Another aspect of the present invention is to provide improved semiconductor power device configuration and manufacture processes for providing semiconductor power devices with trench junction barrier Schottky rectifier in single chip wherein no additional mask is required to integrated the trench junction barrier Schottky rectifier with trench MOSFET compared with the planar Schottky contact and that leads to a cost-down of the production.

Another aspect of the present invention is to provide improved semiconductor power device configuration and manufacture processes for providing semiconductor power devices with trench junction barrier Schottky rectifier in single chip so that the devices with trench contact are able to be shrunk to achieve low specific on-resistance for trench MOSFET, and low Vf and reverse leakage current for trench junction barrier Schottky rectifier.

Briefly, in a preferred embodiment, the present invention discloses a semiconductor power device comprising a trenched MOSFET and a trenched junction barrier Schottky rectifier in single chip. Wherein the trench MOSFET device comprises a trenched gate surrounded by a source region encompassed in a body region above a drain region disposed on a bottom surface of a substrate. The semiconductor power device further includes an insulation layer covering the trenched semiconductor power device with a source-body contact trench opened through and extending into the source and body regions and filled with Tungsten plugs therein. Said Tungsten plugs contact all said source region with a metal of Aluminum alloy or Copper serving as source metal by a layer of Ti, or Ti/TiN deposited along top surface of the insulator layer. A region underneath said contact trench is more heavily doped than the body region to reduce the resistance between said trench contact metal plug and said body region. The trenched junction barrier Schottky rectifier further includes junction barrier Schottky contact trench and more heavily doped region at the bottom of each contact filled with a layer of Ti silicide/TiN or Co silicide/TiN along each trench contact sidewall and Tungsten plug connected to said source metal serving as anode of said Schottky rectifier; other contact trenches formed in the P-body adjacent to said junction barrier Schottky contact trench for said P-body contact to said source metal.

In an exemplary embodiment, the structure disclosed is the same as the structure mentioned in the first embodiment except that there is no heavily doped region underneath junction barrier Schottky trench contact.

In an exemplary embodiment, the structure disclosed is the same as the structure mentioned in the first embodiment except that the trench MOSFET has double gate oxides with thick oxide on trench bottom to reduce the gate charge for power saving.

In an exemplary embodiment, the structure disclosed is the same as the structure mentioned in the second embodiment except that the trench MOSFET has double gate oxides to reduce the gate charge for power saving.

In an exemplary embodiment, the structure disclosed is the same as the structure mentioned in the first embodiment except that there is another N2 doped epitaxial layer above the N1 drift region according to the doping concentration relationship N2<N1 and said junction barrier Schottky trench contact is formed in the N2 doped epitaxial layer to optimize a trade-off between Vf and Ir.

In an exemplary embodiment, the structure disclosed is the same as the structure mentioned in the fifths embodiment except that there is no heavily doped region underneath junction barrier Schottky trench contact.

These and other objects and advantages of the present invention will no doubt become obvious to those of ordinary skill in the art after having read the following detailed description of the preferred embodiment, which is illustrated in the various drawing figures.

DETAILED DESCRIPTION OF THE EMBODIMENTS

Figure 6:
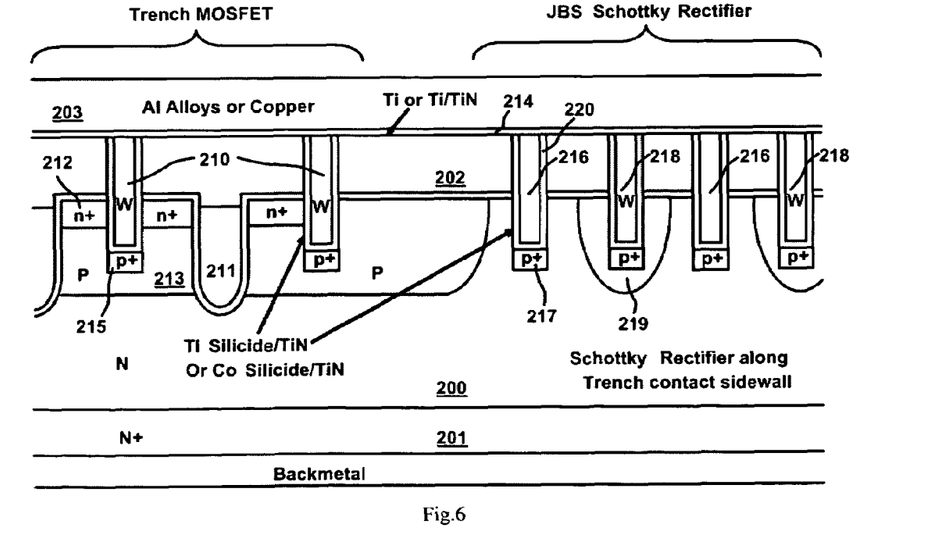
FIG. 6 is a cross-section of an integrated trench MOSFET with junction barrier Schottky rectifier structure of the first embodiment for the present invention.

Please refer to FIG. 6 for a preferred embodiment of this invention where the MOSFET power device with junction barrier Schottky rectifier in one cell are formed in a N epitaxial layer 200 above the a heavily N+ doped substrate 201 coated with back metal on rear side as drain. A trenched gate 211 surrounded by a source region 212 encompassed in a body region 213 formed in a P-well. An insulation layer 202 covering the trenched semiconductor power device with a source-body contact trench 210 opened through and extending into the source and body regions and filled with tungsten plugs therein. A layer of Al Alloys or Copper 203 serves as source metal by a layer of Ti, or Ti/TiN 214 deposited along the top surface of the insulation layer 202. The region 215 is more heavily doped to reduce the resistance between said trench contact metal plug 210 and said body region. The junction barrier Schottky contact trench 216 and more heavily doped region 217 at the bottom of each contact is formed in said N epitaxial layer and other contact trench 218 formed in the P-well 219 adjacent to said junction barrier Schottky contact trench filled with a layer of Ti silicide/TiN or Co silicide/TiN along each trench contact sidewall and Tungsten plug connected to said source metal serving as anode of said Schottky rectifier.

Figure 7:
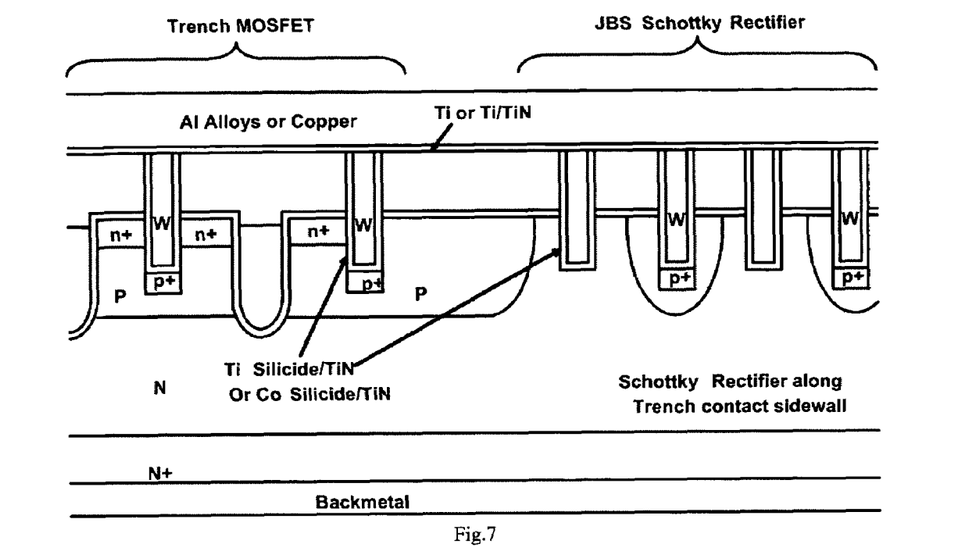
FIG. 7 is a cross-section of an integrated trench MOSFET with junction barrier Schottky rectifier structure of another embodiment for the present invention.

FIG. 7 shows another embodiment of the present invention. The only difference between the structure of FIG. 7 and FIG. 6 is that there is no P+ region underneath the contact trench of junction barrier Schottky rectifier by using additional P+ mask to block P+ Ion Implantation during diffusion process.

Figure 8:
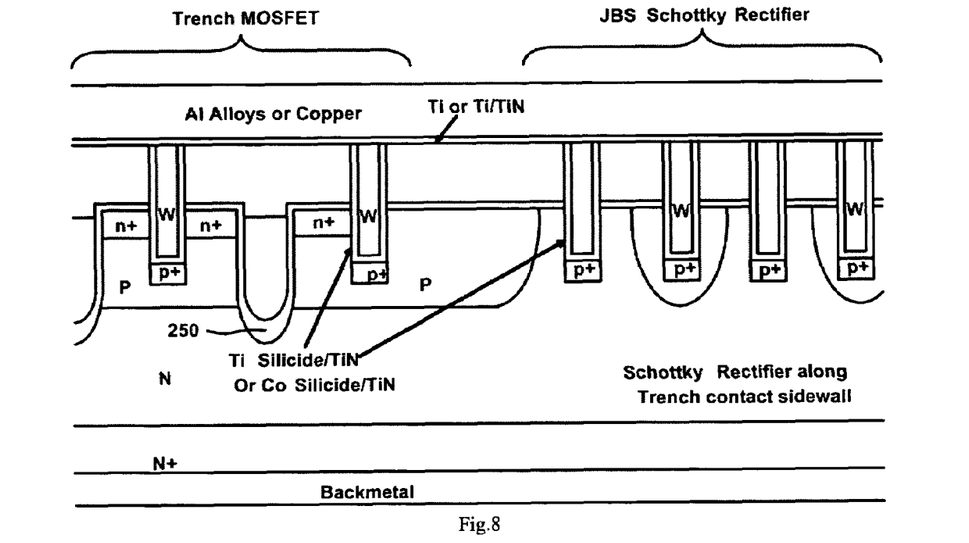
FIG. 8 is a cross-section of an integrated trench MOSFET with junction barrier Schottky rectifier structure of another embodiment for the present invention.

For the purpose of further reduction of the gate charge for power saving, a double gate oxide structure is used, as shown in FIG. 8. The structure illustrated is the same as that in FIG. 6 except the bottom of gate oxide layer 250.

Figure 9:
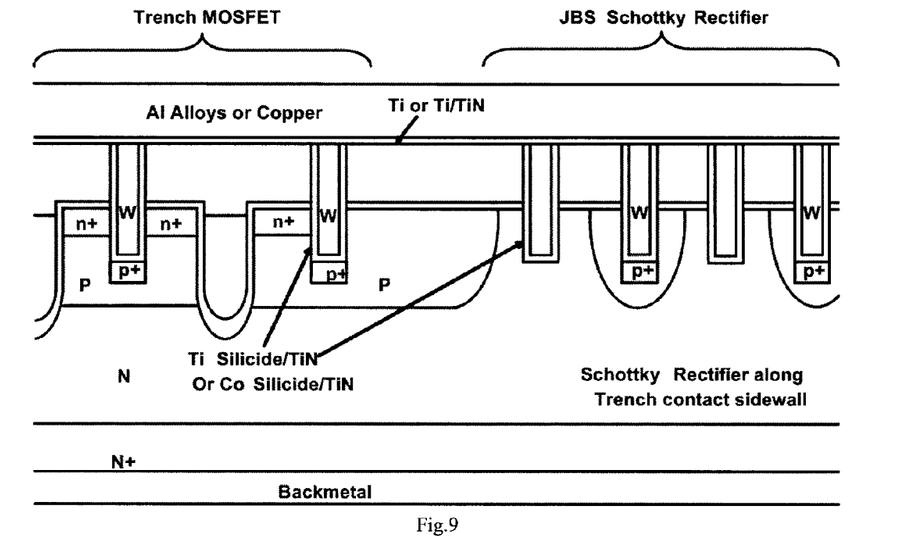
FIG. 9 is a cross-section of an integrated trench MOSFET with junction barrier Schottky rectifier structure of another embodiment for the present invention.

FIG. 9 shows another embodiment of the present invention. The only difference between the structure of FIG. 9 and FIG. 8 is that there is no P+ region underneath the contact trench of junction barrier Schottky rectifier by using additional P+ mask to block P+ Ion Implantation during diffusion process.

Figure 10:
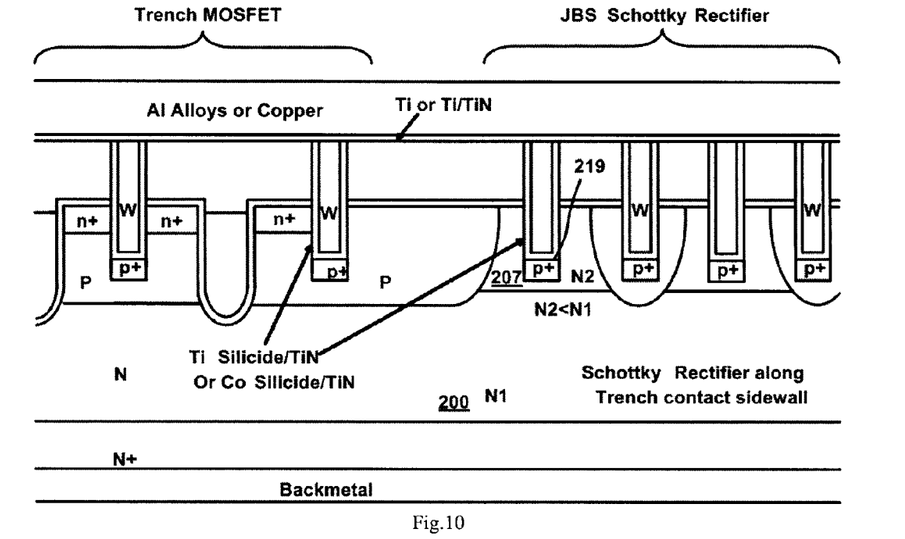
FIG. 10 is a cross-section of an integrated trench MOSFET with junction barrier Schottky rectifier structure of another embodiment for the present invention.

FIG. 10 shows another embodiment of the present invention, the structure is the same as the structure illustrated in FIG. 6 except that there is another N2 doped epitaxial layer 207 above the N1 drift region 200 according to the doping concentration relationship N2<N1 and said junction barrier Schottky trench contact 219 is formed in the N2 doped epitaxial layer 207.

Figure 11:
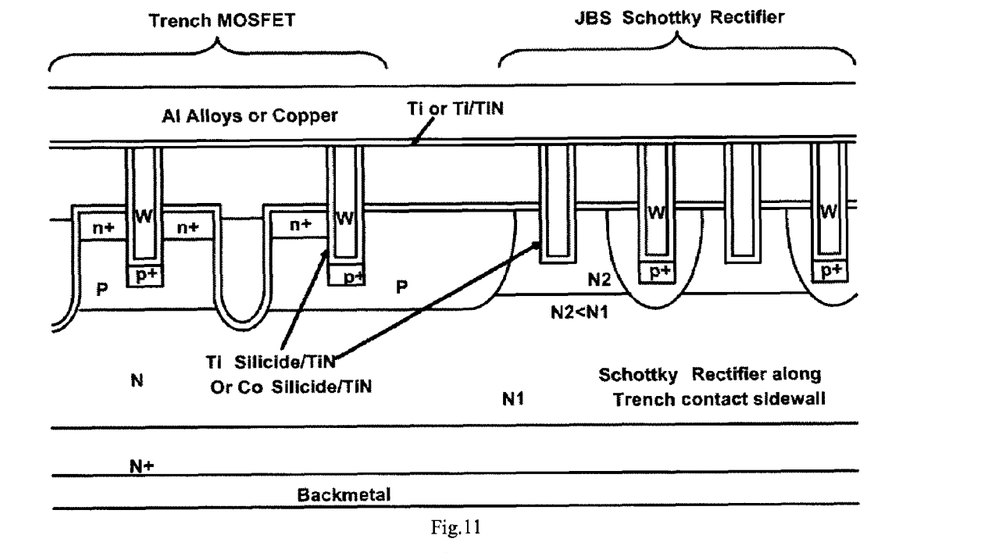
FIG. 11 is a cross-section of an integrated trench MOSFET with junction barrier Schottky rectifier structure of another embodiment for the present invention.

FIG. 11 shows another embodiment of the present invention. The only difference between the structure of FIG. 11 and FIG. 10 is that there is no P+ region underneath the contact trench of junction barrier Schottky rectifier by using additional P+ mask to block P+ Ion Implantation during diffusion process.

Figure 12A:
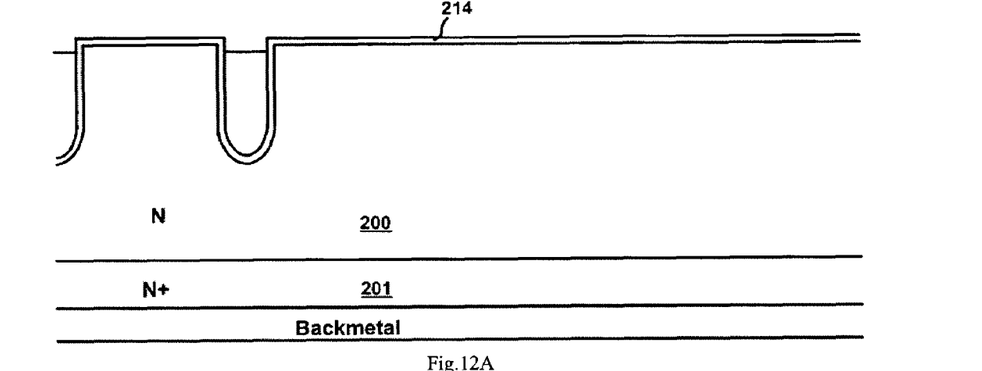
FIGS. 12A to 12D are a serial of side cross sectional views showing the processing steps for fabricating a MOSFET device as shown in FIG. 7 of this invention.

FIGS. 12A to 12D are a series of exemplary steps that are performed to form the inventive device configuration of FIG. 7. FIG. 12A shows that an N doped epitaxial layer 200 is grown on an N+ doped substrate 201. A trench mask (not shown) is applied to open a plurality of trenches by employing a dry silicon etch process. An oxidation process is then performed to form an oxide layer 214 covering the entire structure after a sacrificial oxide is grown and removed. After the formation of the gate oxide, doped poly is filled into the trenches and then etched back, serving as the gate material.

Figure 12B:
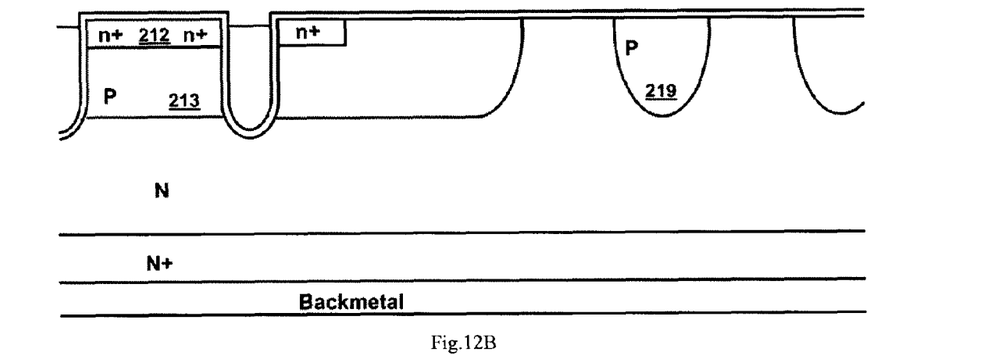
Figure 12C:
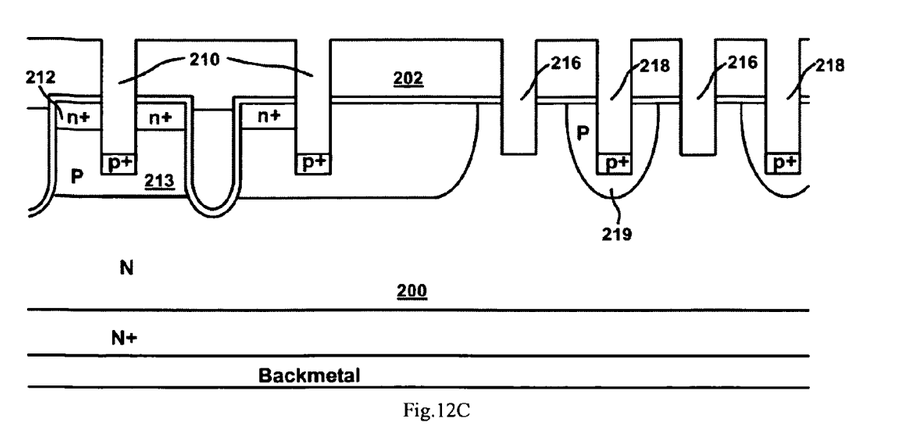

In FIG. 12B, a P-body mask is employed in the P-body Ion Implantation and followed by diffusion process to form the body region 213 and P-body 219, and a N+ source mask is employed in the N+ Ion Implantation and followed by diffusion process to form the source region 212. In FIG. 12C, a layer of insulation 202 is formed by oxide deposition above the whole structure. Followed by employing a contact mask, contact trenches 210 are formed by Dry Oxide Etch through oxide layer 202 and Dry Silicon Etch through source region 212 into the body region 213, while contact trenches 216 extend into the N epitaxial layer 200, and contact trenches 218 extend into the P-body 219. Next, a P+ mask is employed to form the P+ region underneath trenches 210 and 218 in the process of BF2 Ion Implantation.

Figure 12D:
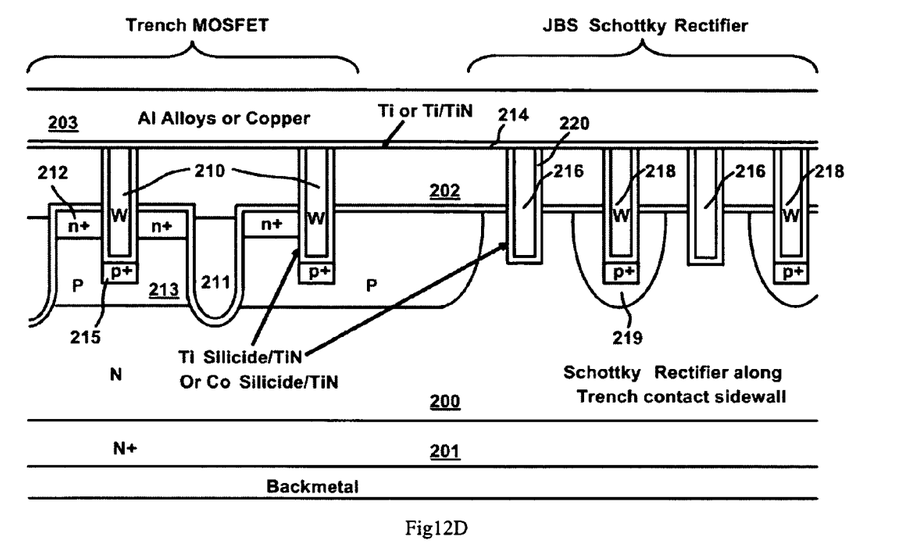

In FIG. 12D, a layer of Ti/TiN or Co/CoN 220 is deposited along the sidewall of each trench. Then the RTA process (730~900° C. for 30 seconds) is applied to form Ti silicide or Co silicide. To fill the contact trenches, tungsten is deposited serving as plug metal. Then, deposited Ti/TiN/W or Co/TiN/W is etched back to expose the portion to deposit a layer of Ti or Ti/TiN 214 acting as a contact metal to short all source regions and anodes of junction barrier Schottky rectifier. Last, a layer of front metal Al Alloys or Copper 203 is deposited above the entire structure while a layer of back metal such as Ti/Ni/Ag is deposited on the rear side of N+ substrate after back grinding to connect the drain of the MOSFET power device and the cathode of the junction barrier Schottky rectifier.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An Integrated Circuit having a plurality of trench MOSFET and a plurality of Junction Barrier Schottky rectifier comprising:

a substrate of the first conductivity type;

an epitaxial layer of said first conductivity type over said substrate, said epitaxial layer having a lower doping than said substrate;

a trenched MOSFET comprising a trenched gate surrounded by a source region encompassed in a body region above a drain region disposed on a bottom surface of a substrate, wherein said trench MOSFET further comprising: an insulation layer covering said integrity circuit with a source-body contact trench opened there through said source region and extended into body regions and filled with a contact metal plug therein, wherein a gate oxide lining said trenched gate and a doped polysilicon within said trench and overlying the gate oxide;

and a junction barrier Schottky rectifier extending into said epitaxial layer and having a barrier layer lined in said contact trench filled with contact metal plug and between a pair of adjacent P-bodies.

2. The epitaxial layer in claim 1 is single or double epitaxial layers with doping concentration of top epitaxial layer less than bottom epitaxial layer.

3. The gate oxide in claim 1 is single gate oxide or double gate oxides with thicker gate oxide on trench bottom.

4. The barrier layer lines said contact trench in claim 1 is Ti/TiN or Co/TiN.

5. The contact metal plug overlying the barrier layers in claim 4 is Tungsten.

6. The Schottky barrier in claim 1 comprises TiSi2 (Ti Silicide) or CoSi2 (Co Silicide).

7. The Schottky barrier in claim 6 lines along contact trench sidewall and bottom, or only sidewall.

8. The integrated circuit of claim 1, further including a layer of Al alloys or copper serving as a source metal on a layer of Ti or Ti/TiN deposited along the top surface of the insulation layer.

* * * * *